US012794108B2

(12) United States Patent
Chua et al.

(10) Patent No.: US 12,794,108 B2
(45) Date of Patent: Nov. 10, 2026

(54) INTEGRATED PACKAGE AND METHOD FOR MAKING THE SAME

(71) Applicant: STATS ChipPAC Pte. Ltd., Singapore (SG)

(72) Inventors: PeiEe Linda Chua, Singapore (SG); HinHwa Goh, Singapore (SG); YaoJian Lin, Jiangsu (CN)

( * ) Notice: Subject to any disclaimer, the term of this patent is extended or adjusted under 35 U.S.C. 154(b) by 347 days.

(21) Appl. No.: 18/459,046

(22) Filed: Aug. 31, 2023

(65) Prior Publication Data

US 2024/0079759 A1 Mar. 7, 2024

(30) Foreign Application Priority Data

Sep. 1, 2022 (CN) ........................ 202211064924.9

(51) Int. Cl.

| | |
|---|---|
| ***H01Q 1/22*** | (2006.01) |
| ***H10W 70/685*** | (2026.01) |
| ***H10W 74/01*** | (2026.01) |
| ***H10W 74/10*** | (2026.01) |

(52) U.S. Cl.

CPC ........ *H01Q 1/2283* (2013.01); *H10W 70/685* (2026.01); *H10W 74/019* (2026.01); *H10W 74/117* (2026.01)

(58) Field of Classification Search

None

See application file for complete search history.

(56) References Cited

U.S. PATENT DOCUMENTS

| | | | | |
|---|---|---|---|---|
| 8,952,521 | B2 | 2/2015 | Wojnowski et al. | |
| 9,721,920 | B2 | 8/2017 | Beer et al. | |
| 10,867,938 | B2 | 12/2020 | Tang et al. | |
| 10,937,719 | B2 * | 3/2021 | Chiang | H10W 70/424 |
| 2018/0269139 | A1 | 9/2018 | Chiang et al. | |
| 2019/0115643 | A1 * | 4/2019 | Khan | H01P 5/107 |
| 2019/0333882 | A1 * | 10/2019 | Kamgaing | H10W 44/20 |
| 2019/0355680 | A1 * | 11/2019 | Chuang | H01Q 1/2283 |

FOREIGN PATENT DOCUMENTS

| | | | |
|---|---|---|---|
| CN | 103779336 | A | 5/2014 |
| CN | 110137088 | A | 8/2019 |
| TW | I741228 | B | 10/2021 |
| WO | 2017167987 | A1 | 10/2017 |

OTHER PUBLICATIONS

The Search Report for the counterpart Chinese patent application 202211064924.9, mailed on Jul. 31, 2026.

* cited by examiner

*Primary Examiner* — Nicholas J Tobergte

(74) *Attorney, Agent, or Firm* — Junhe Law Office P. C.; Yi Zhang

(57) ABSTRACT

An integrated package and a method for making the same are provided. The integrated package includes: a molded substrate having a top substrate surface and a bottom substrate surface; a semiconductor chip embedded in the molded substrate; a bottom antenna structure disposed on the bottom substrate surface and electrically connected to the semiconductor chip; and an antenna package embedded in the molded substrate, and including: an antenna package substrate; and a top antenna structure disposed on the antenna package substrate and configured for coupling electromagnetic energy with the bottom antenna structure.

9 Claims, 9 Drawing Sheets

INTEGRATED PACKAGE AND METHOD FOR MAKING THE SAME

TECHNICAL FIELD

The present application generally relates to semiconductor technology, and more particularly, to an integrated package and a method for making the same.

BACKGROUND OF THE INVENTION

The semiconductor industry is constantly faced with complex integration challenges as consumers want their electronics to be smaller, faster and higher performance with more and more functionalities packed into a single device. Antenna-in-Package (AiP) has emerged as the mainstream antenna packaging technology for various applications. The AiP allows integration of an antenna and a RF chip (e.g., transceiver) in a single package. However, the conventional AiP technology is complex, resulting in excess cost and low reliability.

Therefore, a need exists for a simple and cost effective AiP technology.

SUMMARY OF THE INVENTION

An objective of the present application is to provide a simple and cost effective integrated package.

According to an aspect of embodiments of the present application, an integrated package is provided. The integrated package may include: a molded substrate having a top substrate surface and a bottom substrate surface; a semiconductor chip embedded in the molded substrate; a bottom antenna structure disposed on the bottom substrate surface and electrically connected to the semiconductor chip; and an antenna package embedded in the molded substrate, and including: an antenna package substrate; and a top antenna structure disposed on the antenna package substrate and configured for coupling electromagnetic energy with the bottom antenna structure.

According to another aspect of embodiments of the present application, a method for making an integrated package is provided. The method may include: providing a semiconductor chip; providing an antenna package, wherein the antenna package includes an antenna package substrate, and a top antenna structure disposed on the antenna package substrate; bonding the semiconductor chip and the antenna package to a carrier; forming an encapsulant on the carrier to encapsulate the semiconductor chip and the antenna package; removing the carrier to expose an active surface of the semiconductor chip; and forming a bottom antenna structure on the active surface of the semiconductor chip, wherein the bottom antenna structure is electrically connected to the semiconductor chip and is configured for coupling electromagnetic energy with the top antenna structure.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

Figure 1:
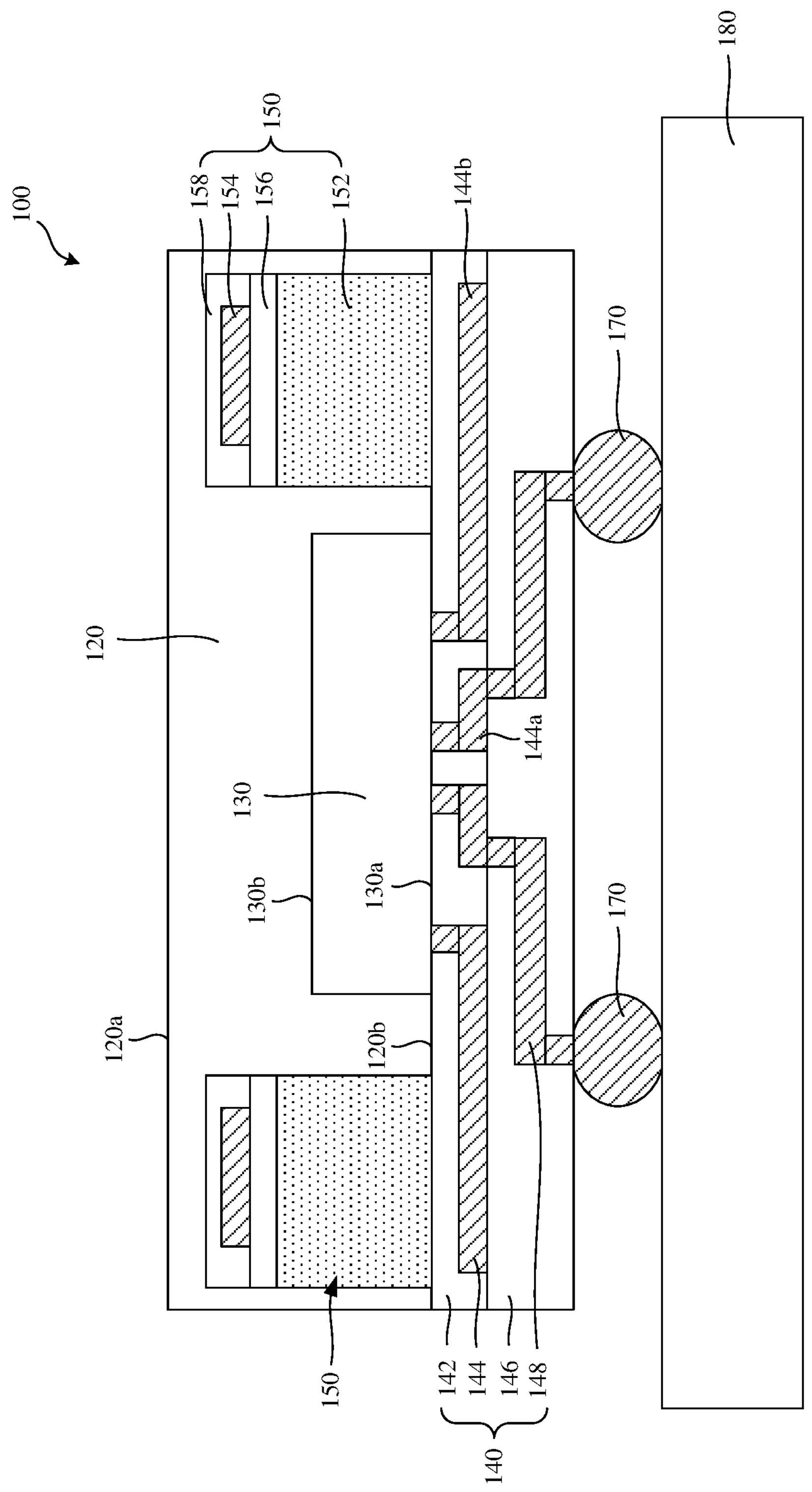
FIG. 1 is a cross-sectional view of an integrated package according to an embodiment of the present application.

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In a conventional AiP device, electrical signals may travel from an integrated circuit chip to an antenna through one or more traces and/or one or more through vias embedded within a substrate such as a printed circuit board. The traces and vias may be surrounded by a dielectric material. However, the dielectric material, such as a molding compound, may suffer from current leakage, stray capacitance, etc. Accordingly, the performance of conventional AiP devices may be impeded.

In some embodiments of the present application, an integrated package is provided. The integrated package includes a molded substrate, in which a semiconductor chip and an antenna package are embedded. A bottom antenna structure is disposed on a bottom surface of the molded substrate and is electrically connected to the semiconductor chip. The antenna package includes a top antenna structure, and the top antenna structure can couple electromagnetic energy with the bottom antenna structure. Accordingly, the semiconductor chip can transmit and receive electromagnetic signals through the electromagnetically coupled bottom and top antenna structures. As there are no wire connections between the bottom antenna structure and the top antenna structure and no through vias formed in the molded substrate, the molded substrate may not suffer from current leakage. Further, the integrated package of the present application has a simpler structure and is more cost effective.

FIG. 1 illustrates a cross-sectional view of an integrated package 100 according to an embodiment of the present application. In the embodiment, the integrated package 100 is mounted on a main board 180 such as a printed circuit board via various solder balls 170. However, it can be appreciated that the integrated package 100 can be mounted onto other devices or components in other appropriate manners.

Referring to FIG. 1, the integrated package 100 includes a molded substrate 120. A semiconductor chip 130 and two antenna packages 150 are embedded in the molded substrate 120. It can be appreciated that more semiconductor chips or another number of antenna packages may be integrated with the molded substrate 120. In some embodiment, only one antenna package may be embedded within the molded substrate 120. The molded substrate 120 may be made of a molding compound such as a polymer composite material. For example, the molding compound may include epoxy resin, epoxy resin with filler, epoxy acrylate with filler, or polymer with proper filler, but the scope of this application is not limited thereto. The molded substrate 120 is nonconductive, provides structural support, and environmentally protects the semiconductor chip 130 and the antenna package 150 from external elements and contaminants. In some embodiments, the molded substrate 120 may be formed using compressive molding, transfer molding, liquid encapsulant molding, or other suitable molding processes. The semiconductor chip 130 and the antenna package 150 may be encapsulated by the molded substrate 120 during the molding process.

The semiconductor chip 130 may include one or more digital chips, analog chips or mixed signal chips, such as application-specific integrated circuit ("ASIC") chips, sensor chips, wireless and radio frequency (RF) chips, memory chips, logic chips or voltage regulator chips. In some embodiments, the semiconductor chip 130 may include an integrated circuit chip for wireless communication and/or signal processing, which may require antennas for transmitting and receiving wireless signals. In some embodiments, the semiconductor chip 130 may further include output and/or input circuits for an antenna structure for wireless communication.

As shown in FIG. 1, the semiconductor chip 130 is manufactured using a surface fabrication process or other similar processes, having an active surface 130*a* and a non-active surface 130*b* which is opposite to the active surface 130*a*. Various types of analog or digital circuits, which may be implemented as active devices and/or passive devices, may be formed close to the active surface 130*a*, and electrically coupled to certain conductive patterns exposed from the active surface 130*a* via a metal interconnect structure of the semiconductor chip 130. In contrast, the non-active surface 130*b* of the semiconductor chip 130 may not have any conductive patterns exposed therefrom. However, the scope of this application is not limited to this embodiment. In another embodiment, one or more additional layers may be formed on the non-active surface 130*b* of the semiconductor chip 130. The one or more additional layers may be made of support or protection or thermal enhancement materials, and may have a thickness ranging from 10 μm to 200 μm. For example, a glass layer may be bonded to the non-active surface 130*b*, or a polymer composite layer may be formed on the non-active surface 130*b*, or a metal layer with/without patterns may be bonded on the non-active surface 130*b*.

As shown in FIG. 1, the active surface 130*a* of semiconductor chip 130 faces downward and is exposed from a bottom surface 120*b* of the molded substrate 120. A redistribution structure (RDS) 140 may be formed below the active surface 130*a* of semiconductor chip 130 and be connected to the active surface 130*a*. The RDS 140 may include one or more dielectric layers and one or more conductive layers between and through the dielectric layers. The conductive layers may define pads, traces and plugs through which electrical signals or voltages can be distributed horizontally and vertically across the RDS 140.

In the example shown in FIG. 1, a first dielectric layer 142 of the RDS 140 may be disposed directly below the lowest metal layer of a metal interconnect structure at the active surface of the semiconductor chip 130. For example, the first dielectric layer 142 may be in contact with the contact patterns formed in the lowest metal layer of the semiconductor chip 130. A first redistribution layer (RDL) 144 may be formed in the first dielectric layer 142 and electrically connected to the contact patterns of the semiconductor chip 130 via one or more conductive vias. A second dielectric layer 146 may be further formed below the first dielectric layer 142, and a second redistribution layer 148 may be formed in the second dielectric layer 146 and electrically connected to the first redistribution layer 144 via one or more conductive vias. A plurality of solder balls 170 may be formed between the second dielectric layer 146 and the main board 180. In some embodiments, the first dielectric layer 142 and the second dielectric layer 146 may include silicon nitride, silicon oxynitride, FTEOS, SiCOH, polyimide, BCB or other organic polymers, or combinations thereof. The first redistribution layer 144 and the second redistribution layer 148 may include one or more of Cu, Al, Sn, Ni, Au, Pd, Ag, Ti, TiW or any other suitable electrically conductive materials.

The RDS 140 shown in FIG. 1 can be formed in accordance with a standard Embedded Wafer Level Ball Grid Array (eWLB) process, but aspects of the present application are not limited thereto. It could also be understood that the RDS 140 may be implemented in various structures and types, and the example shown in FIG. 1 is used only for illustration. For example, the number of redistribution layers is not limited to two as shown in FIG. 1.

Continuing referring to FIG. 1, the first redistribution layer 144 may include a first portion 144*a* connected to the second redistribution layer 148, which serves as an interconnect structure. Furthermore, the first redistribution layer 144 may also include a second portion 144*b* which is not connected to the second redistribution layer 148. The second portion 144*b* may serve as a bottom antenna structure for the semiconductor chip 130, such that it can transmit and/or receive wireless communication signals from or to the semiconductor chip 130. The bottom antenna structure 144*b* may include various types or shapes of antennas such as planar antennas. For example, the second portion 144*b* may take the form of a planar coil that meanders in the first dielectric layer 142.

Referring to FIG. 1, two antenna packages 150 are embedded in the molded substrate 120. Each antenna package 150 may be pre-formed, and at least include an antenna package substrate 152 and a top antenna structure 154. The antenna package substrate 152 may include a molding compound, for example, encapsulant, and can be formed using a molding process. For example, the antenna package substrate 152 may have a same or different material as the molded substrate 120. In particular, the top antenna structure 154 is disposed above the antenna package substrate 152 and is configured for coupling electromagnetic energy with the bottom antenna structure 144*b* through the mutual coupling effect. As shown in FIG. 1, a bottom surface of the antenna package substrate 152 is substantially flush or coplanar with the active surface 130*a* of the semiconductor chip 130. The top antenna structure 154 may have a similar shape as the bottom antenna structure 144*b* in some embodiments. For example, when viewed from top of the integrated package 100, the top antenna structure 154 may at least partially overlap with the bottom antenna structure 144*b*. The more the top antenna structure 154 and the bottom antenna structure 144*b* overlap, the better the mutual coupling effect is.

In the example shown in FIG. 1, the antenna package 150 may further include a bottom passivation layer 156 and a cap passivation layer 158. The bottom passivation layer 156 is disposed between the antenna package substrate 152 and the top antenna structure 154 for providing electrical isolation and improving adhesion. The cap passivation layer 158 is disposed on the bottom passivation layer 154 and covers the top antenna structure 154. The cap passivation layer 158 can environmentally protect the top antenna structure 154 from external elements and contaminants. In some embodiments, the bottom passivation layer 156 and the cap passivation layer 158 may be made of dielectric materials having low loss tangent (DO properties (for example, ≤0.02). In some embodiments, the dielectric materials may have low permittivity (Dk) (for example, ≤4) or high Dk (for example, >4) properties according to actual needs.

It should be noted that, the bottom passivation layer 156 and the cap passivation layer 158 may be optional. In some other embodiments, the antenna package may include only one of the bottom passivation layer and the cap passivation layer, or may include neither the bottom passivation layer nor the cap passivation layer.

It should be noted that each of the two antenna packages 150 in FIG. 1 includes a top antenna structure 154, which is coupled to a respective bottom antenna structure 144*b* of the semiconductor chip 130. Accordingly, the two top antenna structures 154 may jointly or individually transmit electromagnetic radiation to and/or receive electromagnetic radiation from the two bottom antenna structures 144*b* of the semiconductor chip 130. However, the number or configuration of the top antenna structure is not limited to the example shown in FIG. 1. For example, the integrated package may include only one or more than two top antenna structures in other embodiments, and more layers of antenna structures may be formed within the integrated package. In the example shown in FIG. 1, the two top antenna structures 154 are coplanar with each other, but aspects of the present application are not limited thereto. In some other embodiments, the two top antenna structures may be at different levels, such that the two antenna packages can have different heights for different target frequencies.

As the top antenna structures 154 and the bottom antenna structure 144*b* are electromagnetically coupled with each other, it is desired that a distance between the top antenna structures 154 and the bottom antenna structures 144*b* be carefully controlled in consideration of patterns of the top antenna structures 154 and the bottom antenna structures 144*b*, and the characteristics (e.g., the permittivity (Dk) and loss tangent (DO) of the antenna package substrate 152, the first dielectric layer 142, and any other intermediate layers. For example, the distance between the top antenna structures 154 and the bottom antenna structure 144*b* may be 150 μm, 200 μm, 250 μm, 270 μm, 280 μm, 290 μm, 310 μm, 360 μm, or other values according to the specific application scenario. However, it can be appreciated that the distance between the top antenna structures 154 and the bottom antenna structure 144*b* can be modified or adjusted based on actual calculation or simulation results, for example, using commercial electromagnetic simulation software such ANSYS HFSS. Further, in order to avoid that the semiconductor chip 130 blocks the electromagnetic radiation from the top antenna structures 154 or the bottom antenna structure 144*b* to the external environment, the top antenna structure 154 should be higher than the semiconductor chip 130, with a gap formed between the semiconductor chip 130 and the antenna packages 150. Preferably, a vertical distance between the top antenna structure 154 and the semiconductor chip 130 may be equal to or greater than 5 μm, for example, 6 μm, 10 μm, 20 μm, 30 μm, 35 μm, etc. The gap between the semiconductor chip 130 and the antenna packages 150 may be equal to or greater than 50 μm, for example, 60 μm, 100 μm, 120 μm, 140 μm, 200 μm etc.

In the example shown in FIG. 1, the molded substrate 120 covers the top surface and lateral surfaces of the antenna packages 150 to protect the antenna packages 150. For example, a top surface 120*a* of the molded substrate 120 is 20 μm higher than the top surface of the antenna packages 150. However, the present application is not limited thereto. For example, one or more surfaces such as the lateral surface of the antenna package 150 may be exposed from the molded substrate 120.

Figure 2:
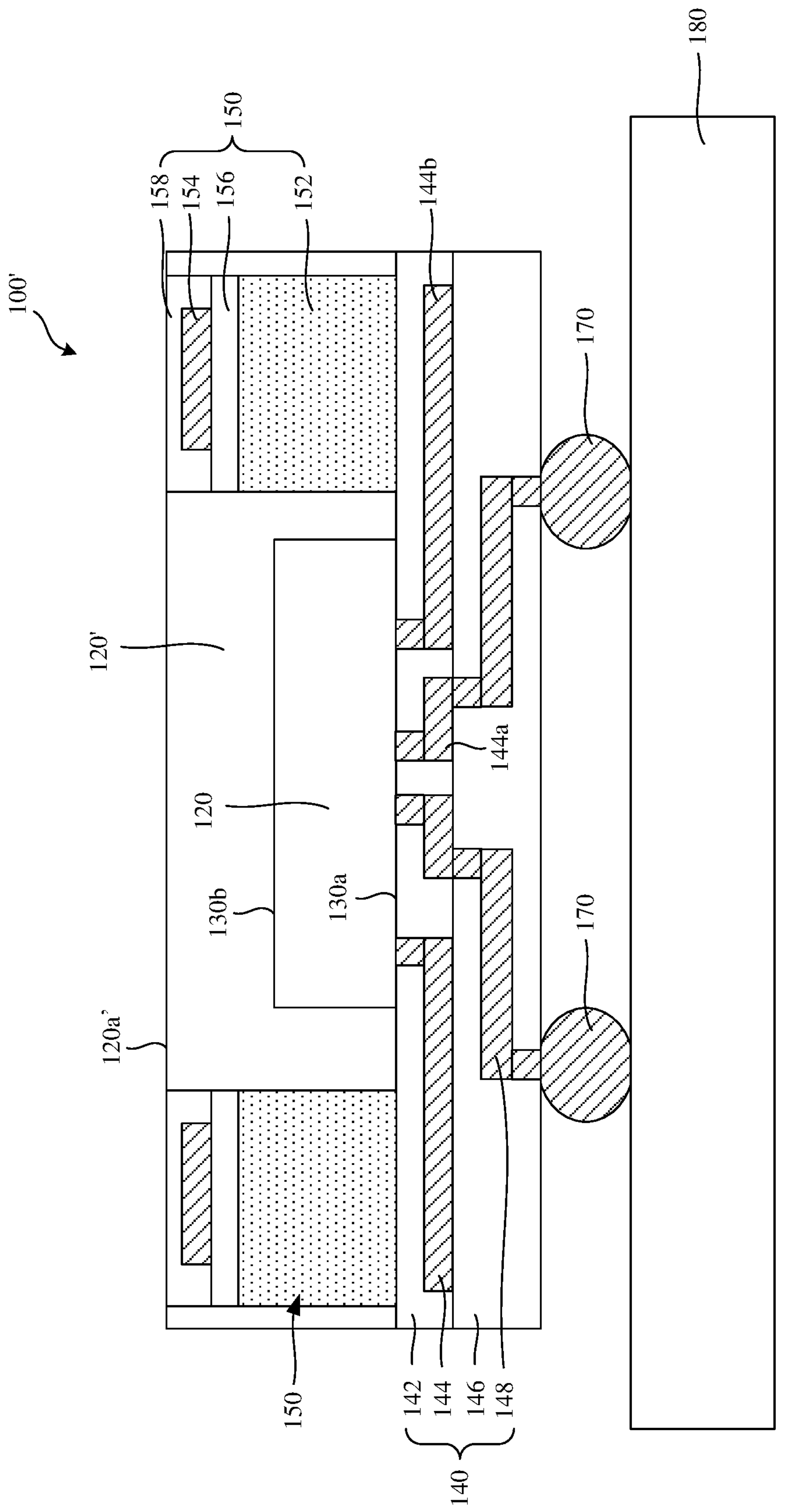
FIG. 2 is a cross-sectional view of an integrated package according to another embodiment of the present application.

FIG. 2 illustrates a cross-sectional view of another integrated package 100' according to an embodiment of the present application. The integrated package 100' may have a same configuration as the integrated package 100 shown in FIG. 1, except that a top surface 120*a*' of a molded substrate 120' in the integrated package 100' is substantially flush with the top surface of the antenna packages 150.

Figure 3A:
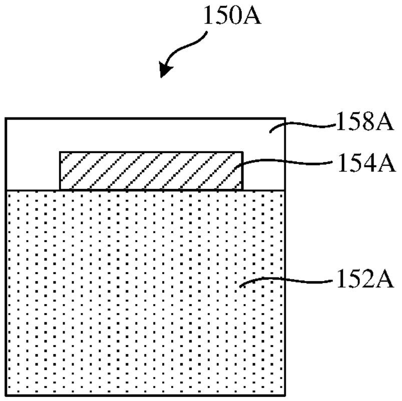
FIG. 3A, FIG. 3B and FIG. 3C are cross-sectional views of different antenna packages according to some embodiments of the present application.
Figure 3B:
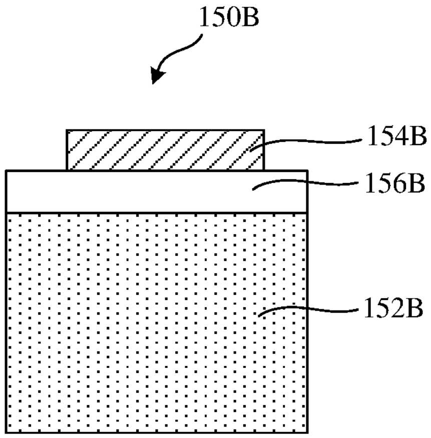
Figure 3C:
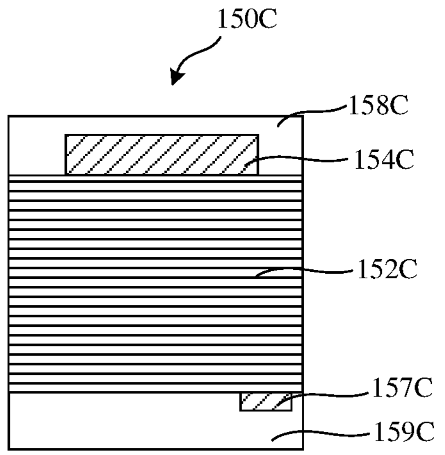

FIG. 3A, FIG. 3B and FIG. 3C illustrate cross-sectional views of different antenna packages 150A, 150B and 150C respectively according to alternative embodiments of the present application.

As shown in FIG. 3A, the antenna package 150A includes an antenna package substrate 152A and a top antenna structure 154A directly disposed on the antenna package substrate 152A. The antenna package 150A further includes a cap passivation layer 158A. The cap passivation layer 158A covers the top antenna structure 154A, and is in direct contact with the antenna package substrate 152A. The antenna package 150A may have a similar configuration as the antenna package 150 shown in FIG. 1, except that the bottom passivation layer 156 of the antenna package 150 is omitted.

As shown in FIG. 3B, the antenna package 150B includes an antenna package substrate 152B and a bottom passivation layer 156B. The bottom passivation layer 156B is disposed on the antenna package substrate 152B, and a top antenna structure 154B is disposed on the bottom passivation layer 156B. The antenna package 150B may have a similar configuration as the antenna package 150 shown in FIG. 1, except that the cap passivation layer 158 of the antenna package 150 is omitted.

As shown in FIG. 3C, the antenna package 150C includes an antenna package substrate 152C, and a top antenna structure 154C disposed on the antenna package substrate 152C. However, the antenna package substrate 152C is not made of a molding compound material, but includes a PCB prepreg component and a PCB core component that are assembled together. The PCB core component may include glass-reinforced epoxy laminate sheets. The PCB prepreg component may be of a dielectric material and can be packed in between two PCB core components to provide desired insulation performance. Thus, the antenna package substrate 152C can be easily fabricated by binding the PCB core components with the PCB prepreg component. As shown in FIG. 3C, the antenna package 150C further includes a top solder mask layer 158C and a bottom solder mask layer 159C. The top solder mask layer 158C is disposed on the top antenna structure 154C, and covers a top surface and lateral surfaces of the top antenna structure 154C. The bottom solder mask layer 159C is disposed on a bottom surface of the antenna package substrate 152C for adhering the antenna package 150C to a substrate. The top solder mask layer 158C and the bottom solder mask layer 159C may include various photosensitive resin compositions or various heat curable resin compositions.

In some embodiments, the antenna package 150C may further include one or more fiducial marks 157C that may be disposed in the bottom solder mask layer 159C, which is close to the RDS 140 when the antenna package 150C is mounted onto the RDS 140. The fiducial marks 157C may assist with alignment of the antenna package 150C with the RDS 140 during assembling, and thus can improve the electromagnetic coupling therebetween.

Referring to FIGS. 4A to 4E, various steps of a method for forming an antenna package are illustrated according to an embodiment of the present application. For example, the method may be used to form the antenna package 150 shown in FIG. 1. In the following, the method will be described with reference to FIGS. 4A to 4E in more details.

Figure 4A:
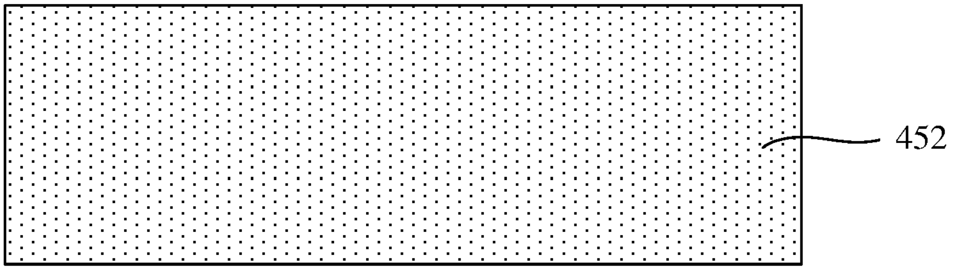
FIGS. 4A to 4E are cross-sectional views illustrating various steps of a method for making an antenna package according to an embodiment of the present application.

As shown in FIG. 4A, a blanket molded substrate 452 is provided. The molded substrate 452 may include a molding compound such as a polymer composite material. For example, the molding compound may include epoxy resin, epoxy resin with filler, epoxy acrylate with filler, or polymer with proper filler. The molded substrate 452 may be formed using compressive molding, transfer molding, liquid encapsulant molding, or other suitable molding processes. The molded substrate 452 can provide structural support for an antenna structure formed in subsequent steps.

Figure 4B:
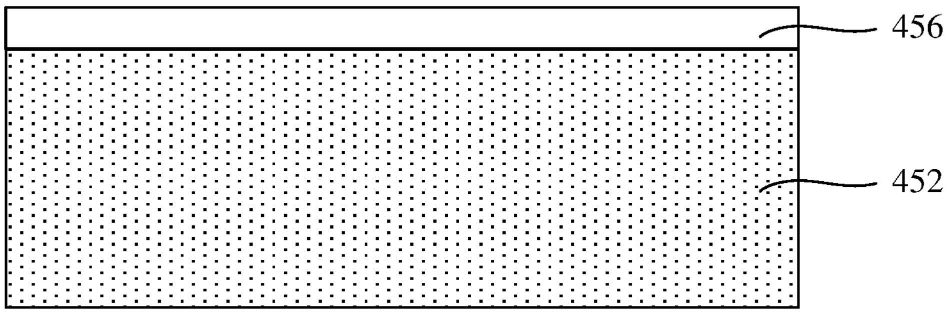

As shown in FIG. 4B, a bottom passivation layer 456 is formed on the molded substrate 452. The bottom passivation layer 456 may include silicon nitride, silicon oxynitride, fluorinated tetraethylorthosilicate (FTEOS), SiCOH, polyimide, benzocyclobutene (BCB) or other organic polymers, or combinations thereof, and may be formed by spray coating, sputtering, or any other suitable deposition process.

Figure 4C:
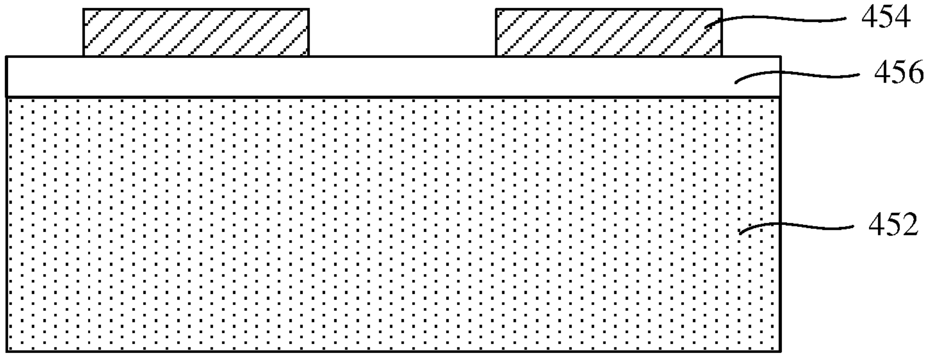

As shown in FIG. 4C, one or more top antenna structures 454 can be formed on the bottom passivation layer 456. In some embodiments, a metal layer (for example, Cu, Al, Sn, Ni, Au, Pd, Ag, Ti, TiW or any other suitable electrically conductive materials) may be formed on the bottom passivation layer 456 by spray coating, plating, sputtering, or any other suitable metal deposition process, and then is patterned to a desired shape by a photolithography process to form the antenna structures 454. However, the present application is not limited thereto, and other suitable processes can be used to form the top antenna structures 454. For example, one or more layers of passivation layers and corresponding antenna structures may be formed above the top antenna structures 454.

Figure 4D:
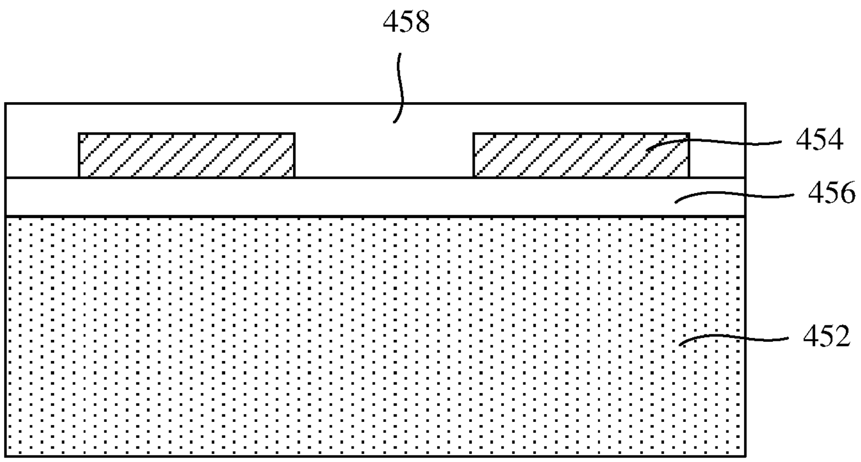

As shown in FIG. 4D, a cap passivation layer 458 is formed on the top antenna structures 454. The passivation layer 458 covers a top surface and lateral surfaces of the top antenna structures 454, and can environmentally protect the top antenna structure 454 from external elements and contaminants. The cap passivation layer 458 may have a same or different material as the bottom passivation layer 456.

Figure 4E:
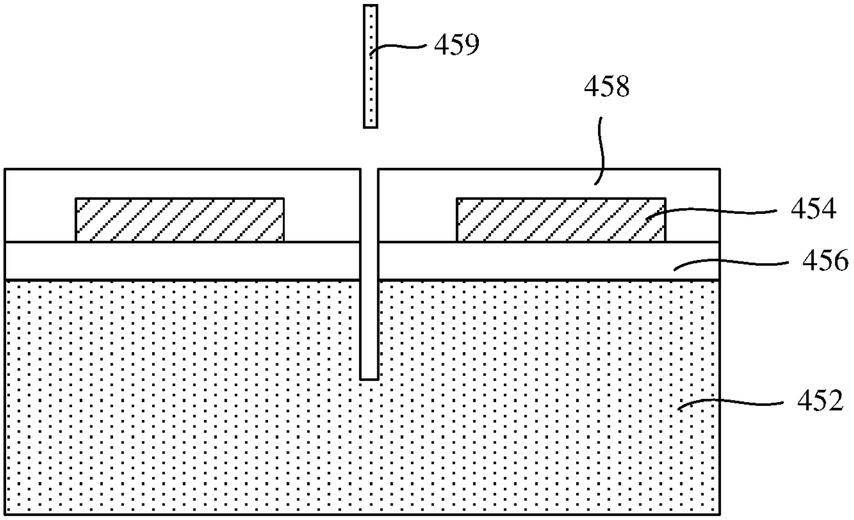

As shown in FIG. 4E, the blanket molded substrate 452 is singulated to form a plurality of individual antenna packages. For example, as shown in FIG. 4E, the molded substrate 452 can be singulated into antenna packages using a saw blade 459. In some other examples, a laser cutting tool can also be used to singulate the molded substrate 452.

In some embodiments, before the molded substrate 452 is singulated, the molded substrate 452 may be flipped and the cap passivation layer 458 may be attached to a carrier. Then, a back-grinding process may be performed to reduce a thickness of the molded substrate 452. After grinding, the molded substrate 452 can be removed from the carrier.

In some embodiments, at least two fiducial marks may be formed in the antenna package. The fiducial marks can be used in a pick and place process to accurately align the antenna package with the substrate, which will be described in detail below. The fiducial marks can be formed in the bottom passivation layer 456, the cap passivation layer 458, or the top antenna structures 454.

It could be understood that the method described with reference to FIGS. 4A to 4E can also be used to form the antenna packages 150A, 150B and 150C shown in FIG. 3A, FIG. 3B and FIG. 3C by varying specific materials or processes, which will not be elaborated herein.

Referring to FIGS. 5A to 5E, various steps of a method for forming an integrated package are illustrated according to an embodiment of the present application. For example, the method may be used to form the integrated package 100 shown in FIG. 1. In the following, the method will be described with reference to FIGS. 5A to 5E in more details.

Figure 5A:
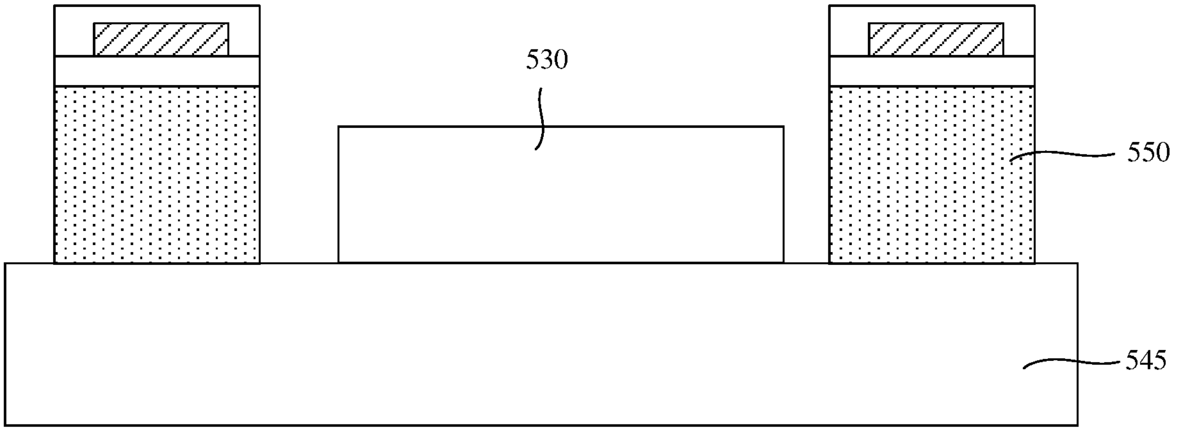
FIGS. 5A to 5E are cross-sectional views illustrating various steps of a method for making an integrated package according to an embodiment of the present application.

As shown in FIG. 5A, a semiconductor chip 530 and an antenna package 550 are provided, and then the semiconductor chip 530 and an antenna package 550 are bonded to a carrier 545. The semiconductor chip 530 may include an integrated circuit chip for wireless communication, and the antenna package 550 may be similar as the antenna package 150 shown in FIG. 1, the antenna package 150A shown in FIG. 3A, the antenna package 150B shown in FIG. 3B, or the antenna package 150C shown in FIG. 3C. The carrier 545 may be a glass carrier or any suitable carrier for the manufacturing method of the integrated package. The fiducial marks formed in the antenna package 550 (for example, the fiducial mark 157C formed in the antenna package 150C shown in FIG. 3C) can be used in the pick and place process to accurately align the antenna package 550 with the carrier 545.

Figure 5B:
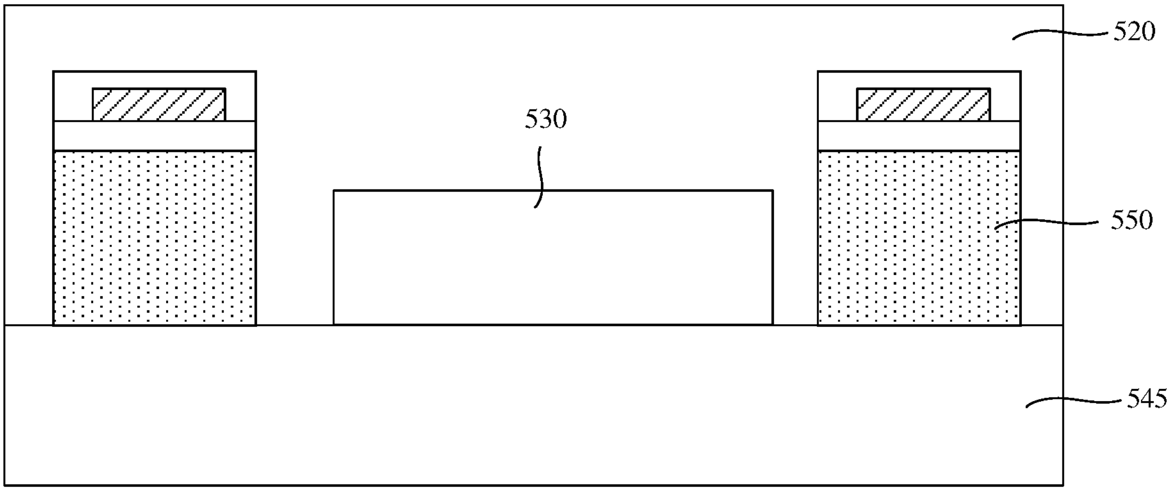

As shown in FIG. 5B, an encapsulant 520 is formed on the carrier 545 to encapsulate the semiconductor chip 530 and the antenna package 550. The encapsulant 520 may include epoxy resin, epoxy resin with filler, epoxy acrylate with filler, or polymer with proper filler, but the scope of this application is not limited thereto. In some embodiments, the encapsulant 520 may be formed by using compressive molding, transfer molding, liquid encapsulant molding, or other suitable molding processes. Then, the carrier 545 can be removed from the encapsulant 520.

Figure 5C:
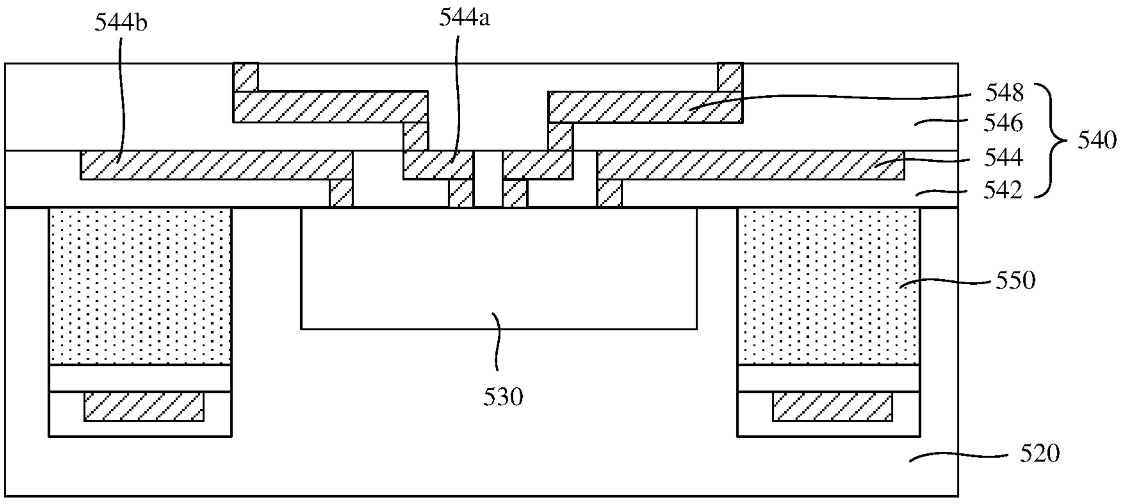

As shown in FIG. 5C, the structure formed in FIG. 5B is flipped and a redistribution structure (RDS) 540 is formed on the encapsulant 520. In some embodiments, the RDS 540 can be formed in accordance with a standard Embedded Wafer Level Ball Grid Array (eWLB) process. The RDS 540 may include one or more dielectric layers and one or more conductive layers between and through the dielectric layers. The conductive layers may define pads, traces and plugs through which electrical signals or voltages can be distributed horizontally and vertically across the RDS 540. As shown in FIG. 5C, a first dielectric layer 542 may be formed over the topmost metal layer of the metallization of the semiconductor chip 530, and then a first redistribution layer (RDL) 544 may be formed in the first dielectric layer 542 and electrically connected to contact patterns of the semiconductor chip 530 via one or more conductive vias. A second dielectric layer 546 may be further formed on the first dielectric layer 542, and a second redistribution layer 548 may be formed in the second dielectric layer 546 and electrically connected to the first redistribution layer 544 via one or more conductive vias. In the example shown in FIG. 5C, the first redistribution layer 544 may include a first portion 544*a* connected to the second redistribution layer 548, and a second portion 544*b* not connected to the second redistribution layer 548 but serving as a bottom antenna structure for the semiconductor chip 530. The bottom antenna structure 544*b* may be configured for transmitting/receiving communication signals to the semiconductor chip 530.

In some embodiments, after the RDS 540 is formed on the encapsulant 520, the package formed in FIG. 5C is flipped over. Then, a back-grinding process may be performed to reduce a thickness of the encapsulant 520. In some embodiments, a top surface of the encapsulant 520 is flush with a top surface of the antenna package 550 after grinding the encapsulant 520. In some embodiments, a top surface of the encapsulant 520 is above a top surface of the antenna package 550 after grinding the encapsulant 520.

Figure 5D:
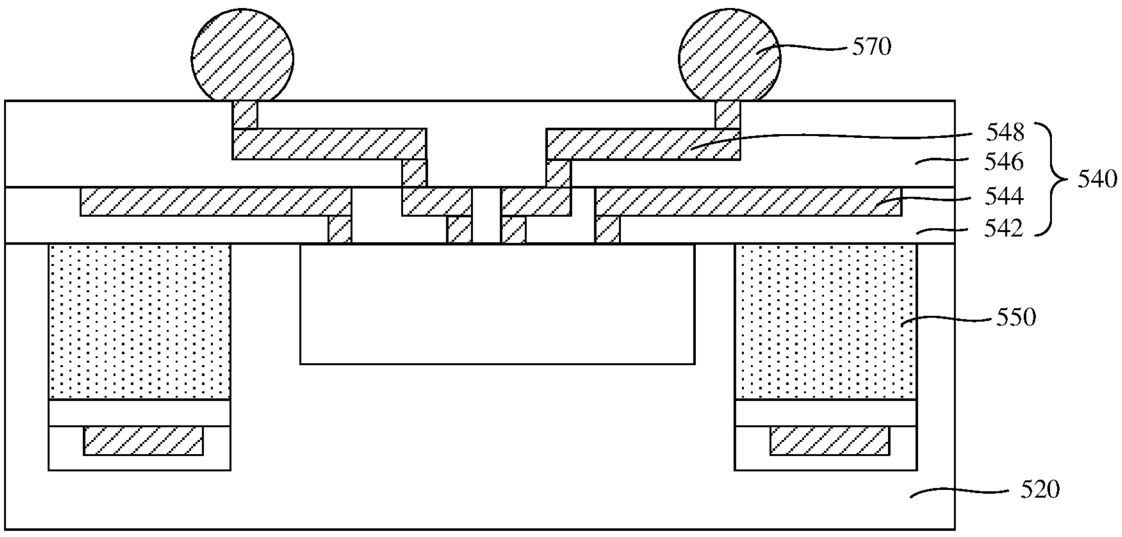

As shown in FIG. 5D, a plurality of solder balls 570 may be formed on the second dielectric layer 546 and electrically connected to the second redistribution layer 548 via one or more conductive vias. In some embodiments, an under-ball metal (UBM) layer may be formed under the solder balls 570 to improve interface performance.

Figure 5E:
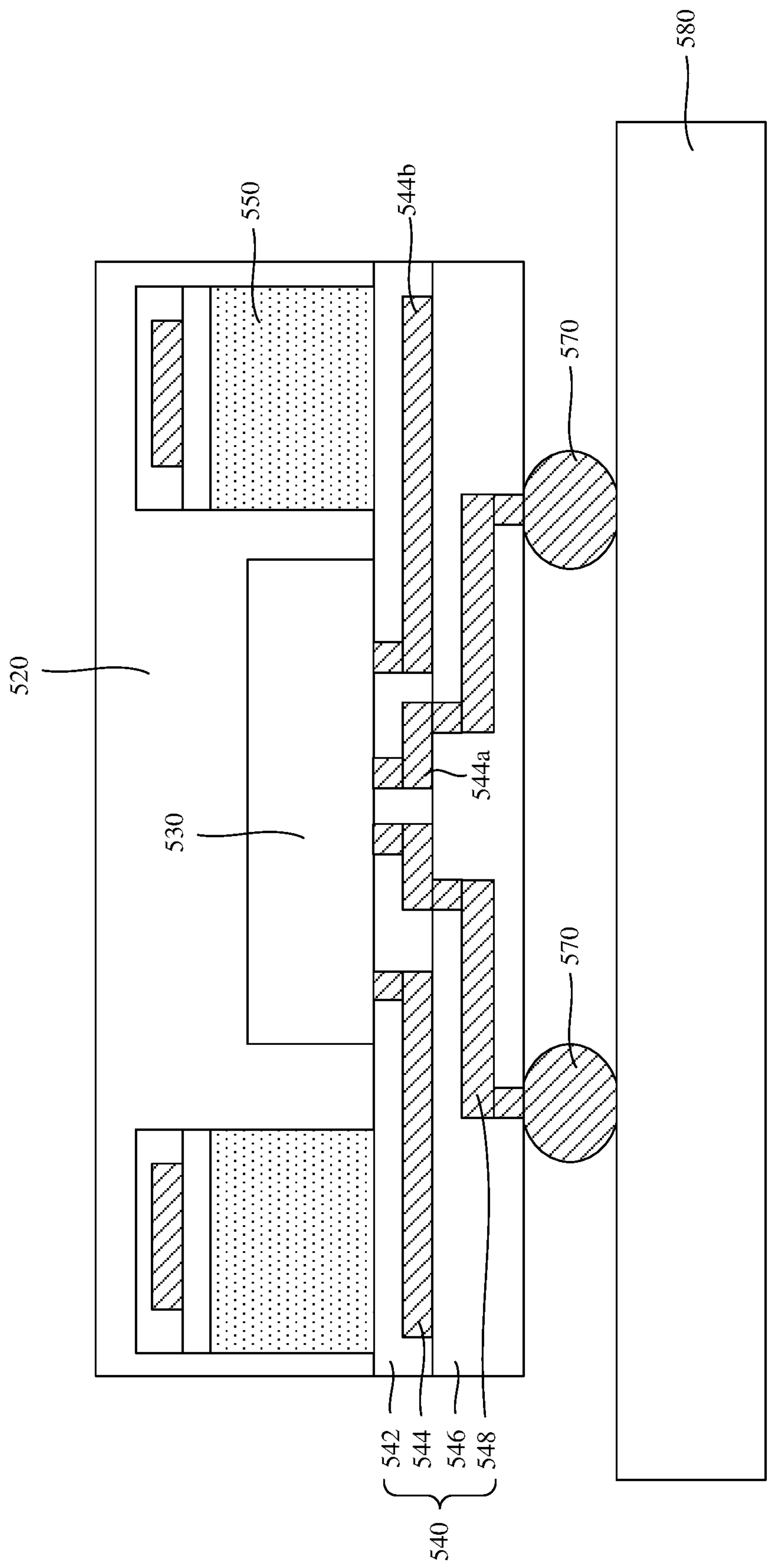

As shown in FIG. 5E, the package formed in FIG. 5D is flipped over and is mounted onto a printed circuit board 580 via the plurality of solder balls 570. Accordingly, the integrated package can be obtained. It can be appreciated that the method as shown in FIGS. 5A to 5E does not require a double sided RDL process, which reduces the complexity of the manufacturing process.

While the processes for making the integrated package are illustrated in conjunction with corresponding figures, it will be understood by those skilled in the art that modifications and adaptations to the process may be made without departing from the scope of the present invention.

The discussion herein included numerous illustrative figures that showed various portions of an integrated package and a method of manufacturing thereof. For illustrative clarity, such figures did not show all aspects of each example assembly. Any of the example devices and/or methods provided herein may share any or all characteristics with any or all other devices and/or methods provided herein. It could be understood that, embodiments described in the context of one of the devices or methods are analogously valid for the other devices or methods. Similarly, embodiments described in the context of a device are analogously valid for a method, and vice versa. Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. An integrated package, comprising:

a molded substrate having a top substrate surface and a bottom substrate surface;

a semiconductor chip embedded in the molded substrate;

a bottom antenna structure disposed on the bottom substrate surface and electrically connected to the semiconductor chip; and an antenna package embedded in the molded substrate, and comprising:

an antenna package substrate, wherein the antenna package substrate comprises a molding compound;

a top antenna structure disposed on the antenna package substrate and configured for coupling electromagnetic energy with the bottom antenna structure;

a bottom passivation layer disposed between the antenna package substrate and the top antenna structure; and a cap passivation layer disposed on the bottom passivation layer and covering the top antenna structure.

2. The integrated package of claim 1, further comprising:

a redistribution structure formed on the bottom substrate surface, wherein the bottom antenna structure is formed in the redistribution structure.

3. The integrated package of claim 1, wherein the top antenna structure is above the semiconductor chip, and a vertical distance between the top antenna structure and the semiconductor chip is equal to or greater than 5 μm.

4. The integrated package of claim 1, wherein the top substrate surface is above a top surface of the antenna package.

5. The integrated package of claim 1, wherein the top substrate surface is flush with a top surface of the antenna package.

6. A method for making an integrated package, comprising:

providing a semiconductor chip;

providing an antenna package, wherein the antenna package comprises an antenna package substrate, and a top antenna structure disposed on the antenna package substrate;

bonding the semiconductor chip and the antenna package to a carrier;

forming an encapsulant on the carrier to encapsulate the semiconductor chip and the antenna package;

removing the carrier to expose an active surface of the semiconductor chip; and forming a bottom antenna structure on the active surface of the semiconductor chip, wherein the bottom antenna structure is electrically connected to the semiconductor chip and is configured for coupling electromagnetic energy with the top antenna structure, wherein providing the antenna package comprises:

providing the antenna package substrate comprising a molding compound;

forming a bottom passivation layer on the antenna package substrate;

forming the top antenna structure on the bottom passivation layer; and forming a cap passivation layer on the top antenna structure.

7. The method of claim 6, further comprising:

grinding the encapsulant to reduce a thickness of the encapsulant.

8. The method of claim 7, wherein a top surface of the encapsulant is flush with a top surface of the antenna package after grinding the encapsulant.

9. The method of claim 7, wherein a top surface of the encapsulant is above a top surface of the antenna package after grinding the encapsulant.

* * * * *